United States Patent [19]

Kamath et al.

[11] 4,238,252
[45] Dec. 9, 1980

[54] PROCESS FOR GROWING INDIUM PHOSPHIDE OF CONTROLLED PURITY

[75] Inventors: G. Sanjiv Kamath, Malibu; Douglas E. Holmes, Thousand Oaks, both of Calif.

[73] Assignee: Hughes Aircraft Company, Culver City, Calif.

[21] Appl. No.: 56,495

[22] Filed: Jul. 11, 1979

[51] Int. Cl.³ .......................................... H01L 21/208
[52] U.S. Cl. ..................... 148/171; 148/172; 148/175
[58] Field of Search ......................... 148/171, 172, 175

[56] References Cited

U.S. PATENT DOCUMENTS

| | | | |
|---|---|---|---|
| 3,397,094 | 8/1968 | Webb | 148/174 |
| 3,560,275 | 2/1971 | Kressel et al. | 148/171 |
| 3,623,905 | 11/1971 | Akai et al. | 148/171 X |
| 3,762,943 | 10/1973 | Winstel et al. | 148/171 X |
| 3,836,408 | 9/1974 | Kasano | 148/175 |
| 3,883,313 | 5/1975 | Cullen et al. | 148/171 X |
| 3,994,755 | 11/1976 | Kamath et al. | 148/172 |
| 4,004,953 | 1/1977 | Otsubo et al. | 148/171 X |
| 4,008,485 | 2/1977 | Miyoshi et al. | 148/171 X |
| 4,026,735 | 5/1977 | Kamath et al. | 148/171 |
| 4,035,205 | 7/1977 | Lebailly et al. | 148/171 |
| 4,155,784 | 5/1979 | Mills et al. | 148/175 |

OTHER PUBLICATIONS

Weiner, M. E., J. Electrochem. Soc. vol. 119, No. 4, Apr. 1972, pp. 496–504.

*Primary Examiner*—G. Ozaki
*Attorney, Agent, or Firm*—Mary E. Lachman; W. H. MacAllister

[57] ABSTRACT

The specification discloses a process for growing crystals of a Group III-V material having controlled and high purity. The crystal is grown in the presence of hydrogen containing a predetermined amount of water vapor and the water vapor suppresses the concentration of silicon impurities from the reaction chamber, the associated tubing, and/or the starting materials, which are incorporated in the grown crystal. The crystal growth process may be either an epitaxial process or a bulk process. In one embodiment of the invention, the material grown is indium phosphide. In another embodiment of the invention, the process described above is used to grow a series of epitaxial layers of a Group III-V material with each layer having different predetermined impurity concentrations, to form a Gunn diode device.

11 Claims, 4 Drawing Figures

PROCESS FOR GROWING INDIUM PHOSPHIDE OF CONTROLLED PURITY

TECHNICAL FIELD

This invention relates generally to a process for growing crystals of materials of Groups III and V of the periodic table, having controlled and high purity, and, more particularly, to a novel process for growing indium phosphide of controlled and high purity and devices formed by such a process.

BACKGROUND ART

In recent years, there has been an increased interest in the use of indium phosphide (InP) for the manufacture of semiconductor devices. Because of the chemical and physical properties which InP possesses, the use of InP in semiconductor devices expands the range of devices which can be fabricated beyond those which were limited to more commonly used materials such as gallium arsenide (GaAs) or silicon. In particular with respect to microwave devices, InP devices have higher speed, higher power, higher microwave power conversion efficiency, and lower noise than GaAs devices. In addition, InP devices permit working with larger geometries for a given frequency than GaAs devices, thus avoiding the increased cost and difficulty associated with the high resolution lithographic processes required for the fabrication of devices with submicrometer dimensions. The InP used in semiconductor devices is usually in the form of either an epitaxial layer deposited on a substrate or a substrate wafer formed from bulk InP which is subsequently sliced.

In order to grow epitaxial layers of InP, a vapor phase epitaxial process has been used, in which an epitaxial layer is grown on the surface of a substrate from reactants which are in the vapor phase, as described, for example, by R. O. Fairman, M. Omori, and F. B. Fank in the publication entitled "Recent progress in the control of high-purity VPE InP by the PCl$_3$/In/H$_2$ technique," in the *Institute of Physics Conference Serial Number* 336, 1977, page 45. However, a vapor phase epitaxial process has the inherent disadvantage that dopants, such as zinc and other p-type dopants, having a high vapor pressure are not suitable for vapor phase doping since they are difficult to control. Furthermore, materials grown by vapor phase epitaxy have been found to have a relatively high concentration of defects.

As an improvement upon vapor phase epitaxial processes, epitaxial layers of compounds of Group III and Group V elements have been grown from the liquid phase to provide layers with high reproducibility and low carrier concentrations. It has also been shown that, for III-V compounds other than InP, a liquid phase epitaxial (LPE) process can use dopants with high and low vapor pressure which are not suitable for vapor phase epitaxial processes. One liquid phase epitaxial process which is directed to the growth of GaAs layers is disclosed in U.S. Pat. No. 3,994,755, assigned to the present assignee, wherein a selected saturated solution is controllably cooled below its saturation temperature at a predetermined rate to epitaxially deposit a thin GaAs layer of a GaAs substrate. While this type of process has been generally satisfactory, in some cases the problem of thermal shock at the substrate-solution interface has been encountered when the substrate is dipped directly into the molten material, and this, in turn, produces nonuniform nucleation and crystal growth in the epitaxial growth process.

In order to overcome the above-mentioned problem of thermal shock, a horizontal slide bar system, or limited melt system, has been used and is disclosed, for example, by L. R. Dawson in an article entitled "Near Equilibrium LPE Growth of GaAs-Ga$_{1-x}$Al$_x$As Double Heterostructures," in the *Journal of Crystal Growth*, Vol. 27, (1974), pp. 86–96. However, in such a horizontal slide bar system, relatively large amounts of impurities are frequently introduced into the melt as a result of the horizontal orientation and the overall geometry of the system. Thus, the purity of the crystals grown in a horizontal slide bar system is difficult to optimize. In addition, crystals grown in a horizontal slide bar system may be nonuniform in composition, since it is difficult to establish solution homogeneity without stirring, which the horizontal slide bar system cannot provide.

In order to overcome these and other disadvantages of the horizontal slide bar system and to eliminate the previously discussed thermal shock problem of the vertical liquid phase epitaxy processes, a new method was developed and disclosed in U.S. Pat. No. 4,026,735, assigned to the present assignee, wherein a GaAs substrate is placed in a nonreactive container, the container is immersed in a solution and the substrate is retained in the container and shielded from the solution until thermal equilibrium is established between the solution and the container. Then, the solution is cooled to slightly below its saturation equilibrium temperature, the substrate is exposed to the solution, and epitaxial growth on the substrate occurs.

One problem associated with all of the above-mentioned prior liquid phase epitaxial deposition processes is that silicon from the quartz reaction vessel and associated tubing in the deposition apparatus becomes dissolved in the selected saturated solution and is subsequently incorporated in the epitaxially grown layer. In addition, silicon impurities incorporated in a grown crystal may have their origin in the starting materials used to prepare the growth solution. Since silicon is an n-type dopant in InP, the incorporation of silicon impurities in InP produces a high n-type impurity level that increases the conductivity of the InP. Since high purity, high resistivity InP is required for use in certain types of semiconductor devices, the need for minimizing undesired n-type impurities that would increase conductivity is manifest. The impurity level of silicon in InP is particularly high since the segregation coefficient for silicon in InP growth from solution is > 10 for temperatures of approximately 700° C. (The segregation coefficient is defined as the concentration of the impurity in the host solid divided by the concentration of the impurity in the host solution.) The effect of silicon impurities in a grown crystal of a given material depends on the segregation coefficient for silicon in that material. The higher the segregation coefficient, the more noticeable the effect of silicon impurities in a grown crystal of that material.

One mechanism by which the silicon becomes dissolved in the saturated epitaxial growth solution is suggested in the equations shown below. Equation (1) shows the reaction of the hydrogen ambient gas with SiO$_2$ solid(s) from the quartz or other silicon-containing reaction vessel or crystal growth apparatus tubing to form SiO vapor (v) and water. The SiO vapor can be carried to the surface of the crystal growth solution, where the SiO reacts further, as shown in Equation (2), with hydrogen to form silicon, which dissolves in the saturated solution, forming Si(d). The concentration of water formed in Equations (1) and (2) depends on the temperature at which the reaction occurs and the rate of the reaction at that temperature.

$$SiO_2(s) + H_2(v) \rightleftharpoons SiO(v) + H_2O(v) \quad (1)$$

$$SiO(v) + H_2(v) \rightleftharpoons Si(d) + H_2O(v) \quad (2)$$

In one attempt to overcome this problem of a silicon background donor in epitaxial InP grown by a chloride vapor transport method, N. C. Hales and J. R. Knight, in the publication entitled "The Electrical Properties of Vapour Epitaxial Indium Phosphide Grown in the Presence of Oxygen," in the *Journal of Crystal Growth*, Vol. 46, 1979, pages 582-584, have reported that the addition of small quantities of oxygen can suppress the residual donor impurity (i.e., silicon).

A similar approach to reducing the silicon background donor in InP grown by liquid phase epitaxy was reported by S. H. Groves and M. C. Plonko in the publication entitled "LPE growth of nominally undoped InP and $In_{0.8}Ga_{0.2}As_{0.5}P_{0.5}$ alloys," *Institute of Physics Conference Serial Number* 45, pages 71-77. By the process of Groves and Plonko, crystals of InP are grown in a horizontal, fused-silica growth tube with a graphite slider. Oxygen was added to the flow of hydrogen to form water, which is believed to convert silicon impurities in the growth solution to $SiO_2$. A baking period of 17 or more hours was required for this process to be effected.

One specific area in which the growth of epitaxial layers with defined impurity levels is necessary is in the fabrication of Gunn diode or oscillator devices which consist of a series of two or more uniformly doped layers with differing impurity concentrations. (The manner in which a Gunn diode device funtions is described by P. J. Bulman, G. S. Hobson and B. C. Taylor in the book entitled "Transferred Electron Devices," Academic Press, New York, 1972, pages 1-10.) The vapor phase epitaxial process discussed above has been widely used to form Gunn devices, as discussed, for example, by R. J. Hamilton, Jr., R. D. Fairman, S. I. Long, N. Omori, and F. B. Fank, in the publication entitled "InP Gunn-Effect Devices for Millimeter-Wave Amplifiers and Oscillators," in the *IEEE Transactions on Microwave Theory and Techniques*, Vol. MTT-24, No. 11, November 1976, pp. 775-780. Vapor phase epitaxy is especially suited to the fabrication of Gunn devices, since such a process is readily adaptable to rapid changes in n-type dopant profiles, as is required to form multiple epitaxial layers with differing dopant concentrations. However, such a process produces devices with relatively high defect densities, which degrade the performance of the device.

It is the alleviation of these prior art problems associated with producing an epitaxial layer of a III-V material having a controlled level of impurities therein to which the present invention is, in part, directed.

The problem of silicon contamination of InP applies to InP grown in bulk as well as to epitaxially grown InP. Indium phosphide has been grown in bulk for subsequent slicing into substrate wafers. One example of such a bulk growth process is the Czochralski method, or vertical pull method, as described, for example, by Y. Seki, H. Watanobe, and J. Matsui, in the publication entitled "Impurity effect on grown-in dislocation density of InP and GaAs crystals," *Journal of Applied Physics*, Vol. 49, 1978, page 822, in which a seed crystal is immersed in a melt and is then rotated while being slowly withdrawn from the melt. The heating of the melt and the rate of pulling the crystal from the melt are controlled to provide a crystal of the desired size and shape. However, if either the reaction vessel which contains the growth solution of melt or the associated parts of the crystal growth apparatus are made of quartz or of a material which contains silicon, the reactions of Equations (1) and (2) discussed above will occur. Silicon will become dissolved in the growth solution or melt and will be incorporated as an undesired impurity in the InP crystal grown. In addition, silicon impurities from the starting materials may be present. The present invention also seeks to overcome this problem of silicon impurities in bulk-grown InP, as well as in the previously mentioned epitaxially grown InP.

SUMMARY OF THE INVENTION

The general purpose of this invention is to provide a new and improved process for growing crystals of a material formed from elements of Groups III and V of the periodic table and new and improved devices formed by such a process, which possess most, if not all, of the advantages and functions of the above prior art epitaxial and bulk growth processes and devices formed thereby, while overcoming their above-mentioned significant disadvantages.

The above general purpose of this invention is accomplished by providing a crystal growth solution or melt of the starting materials comprising the elements of Groups III and V and an associated crystal growth apparatus comprising a reaction chamber and associated tubing. An atmosphere of hydrogen to which a predetermined amount of water vapor has been added is maintained within the reaction chamber for a predetermined period of time. The crystal is grown in the reaction chamber in the presence of the hydrogen containing water vapor, and the water vapor suppresses the concentration of silicon from the reaction chamber, the associated tubing, and/or the starting materials which is incorporated as an impurity in the grown crystal. The crystal growth process may be either an epitaxial process or a bulk process. In one embodiment of the present invention, the material grown is epitaxial indium phosphide. In another embodiment of the present invention, the process described above is used to grow a series of epitaxial layers of a Group III-V material with each layer having different predetermined impurity concentrations, to form a Gunn diode device.

Accordingly, it is an object of the present invention to provide a new and improved process for growing a crystal of a Group III-V material in which the concentration of silicon impurities in the grown crystal is suppressed.

Another object of the present invention is to provide a new and improved process for depositing a high purity epitaxial layer of a Group III-V compound semiconductor material on a chosen substrate.

Yet another object is to provide a process of the type described wherein the silicon carrier concentration in the epitaxially deposited layer is minimized.

Still another object is to provide a process of the type described which is reproducible.

Another object is to provide a new and improved process for growing high purity epitaxial layers of indium phosphide.

A further object of the present invention is to provide a new and improved process for depositing an epitaxial layer of a Group III-V material which has a controlled silicon impurity concentration therein.

Yet another object of the present invention is to provide a new and improved process for depositing a series of layers of a Group III-V material, with each layer having a different silicon impurity concentration.

A further object of the present invention is to provide a new and improved process for the bulk growth of crystals of a Group III-V compound semiconductor material in which the concentration of silicon impurities from the reaction chamber, associated tubing, and/or starting materials, are suppressed from the grown crystal.

Yet another object of the present invention is to provide a novel Gunn diode device formed by a process that avoids problems of surface contamination and morphology in the fabrication process.

Another object is to provide a Gunn device of the type described which has reproducible, high impurity layers and lowered defect densities.

The foregoing and other objects and advantages of the present invention will be apparent from the following more particular description of the preferred embodiments of the invention, as illustrated in the accompanying drawings.

DETAILED DESCRIPTION OF THE INVENTION

Figure 1:
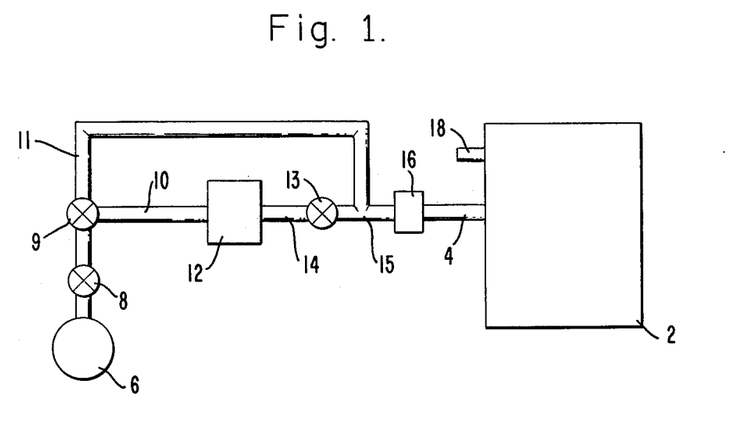
FIG. 1 is a schematic diagram of a simplified apparatus for implementation of the process of the present invention.

FIG. 1 shows in simplified form an apparatus for implementation of the process of the present invention. In a reaction chamber 2, a crystal of a compound semiconductor material formed from elements of Groups III and V of the periodic table (also referred to herein as a III-V material) is grown either by an epitaxial process or by a bulk crystal growth process. The reaction chamber 2 is usually formed from quartz or another silicon-containing material, but may also be formed from other materials suitable for the crystal growth process. Hydrogen containing a predetermined amount of water vapor is introduced into the reaction chamber 2 through a tube 4. A hydrogen ambient atmosphere is used during the crystal growth process in order to provide a high purity environment which is substantially free of oxygen. The hydrogen containing a predetermined amount of water vapor is provided as follows.

Hydrogen from a container 6 is purified by diffusion through a palladium membrane (not shown), and the purified hydrogen passes through a flowmeter 8 which regulates the flow rate of the hydrogen. The hydrogen then passes through a valve 9 which directs the hydrogen either through a tube 10 or through a tube 11. If the valve 9 is set so that the hydrogen passes through the tube 11, the hydrogen is also passed to the T-joint (or Y-joint) at a tube 15. The pure hydrogen then passes through a moisture monitor 16 to be discussed below and then through the tube 4 into the reaction chamber 2. If the valve 9 is set so that the hydrogen passes through the tube 10, the hydrogen passes further to a water source chamber 12 which contains water held at a constant temperature, typically from 17° to 25° C. If necessary, a constant temperature control means, such as a water cooling jacket (not shown), may be used to maintain the required temperature in the chamber 12.

The hydrogen which exits from the source chamber 12 through a tube 14 contains a predetermined amount of water vapor which is controlled by adjusting the temperature in the chamber 12, the flow rate of the hydrogen through the chamber 12, and the surface area of the water in contact with hydrogen in the chamber 12. Typically, these adjustments are made to produce a stream of hydrogen having a water vapor concentration in the range of 0.02 to 10 parts per million. The hydrogen which contains water vapor passes through the tube 14 and a valve 13 to the moisture monitor 16 which accurately measures the water vapor content in the hydrogen gas just prior to its entry into the reaction chamber 2. A suitable moisture monitor is available from Pana Metrics, PI Instruments, Studio City, California. In practice, the flow of pure hydrogen via the tube 11 and the flow of hydrogen containing water vapor through the valve 13 are varied by adjustment of the valves 9 and 13 in order to provide hydrogen having the desired water vapor content as measured by the monitor 16. If pure hydrogen without water vapor is desired, the valve 9 is adjusted so that all the hydrogen from the container 6 passes through the tube 11 and the valve 13 is adjusted so that the gas flow from the tube 14 is shut off. Thus, the hydrogen gas containing a predetermined and measured amount of water vapor is flowed through the tube 4 into the reaction chamber 2, and the crystal growth process can then proceed by any number of known and documented methods. The flow rate of the hydrogen stream is typically approximately 120 cm$^3$/minute. A tube 18 provides for the exit of hydrogen gas from the reaction chamber 2 so that a constant flow of hydrogen through the reaction chamber may be achieved.

One crystal growth process which may be used in accordance with the present invention involves the liquid phase epitaxial growth of a layer of a III-V compound semiconductor material on a substrate by providing a crystal growth solution of the III-V material at a predetermined temperature above the solution liquidus temperature and contacting the solution with the substrate for a predetermined period of time while cooling the solution below the liquidus temperature at a predetermined rate sufficient to cause the single crystal growth of the layer of III-V material. Optionally, predetermined amounts of selected dopants may be added to the solution. Such a liquid phase epitaxial growth process is described, for example, in U.S. Pat. No. 4,026,735, previously discussed in the consideration of the background art. In accordance with the present invention, this growth process is performed with the growth solution maintained for a predetermined period of time in an atmosphere of hydrogen containing a predetermined amount of water vapor.

Another crystal growth process which may be used in accordance with the present invention involves a bulk growth process, such as the Czochralski method as described, for example, by B. Chalmers in the book entitled "Principles of Solidification," John Wiley and Sons Inc., New York, 1964. A seed crystal of a III-V material is immersed in a solution or melt of the same III-V material, with the solution or melt having a predetermined and controlled temperature. The seed crystal is then pulled from the solution or melt at a predetermined rate to form the desired crystal of the III-V material. In accordance with the present invention, this process is performed in the presence of hydrogen containing a predetermined amount of water vapor.

In practicing the present invention, water vapor present in the hydrogen gas suppresses the reaction of the hydrogen with the quartz reaction chamber and associated tubing by shifting the equilibrium of the reaction of Equation (1), discussed above, to the left. Thus, significantly reduced amounts of SiO and subsequently Si [formed as shown in Equation (2) herein] are formed, and reduced amounts of Si are incorporated as impurities into the crystal growth solution or melt and ultimately in the crystal as grown. Consequently, crystals of III-V materials having reduced silicon impurity concentrations and the attendant improved performance characteristics may be formed.

If the silicon impurities are contributed only by the starting materials used to prepare the growth solution or melt, the water vapor present in the hydrogen gas shifts the equilibrium of Equation (2) to the left. Thus, the amount of Si(d) in solution which could subsequently be incorporated in the crystal as grown is reduced. If the only source of the silicon impurities is the starting materials, by the process of the present invention, a predetermined amount of water vapor is added to the hydrogen gas for a predetermined period of time and then the addition of water vapor is discontinued in order to avoid possible detrimental side reactions.

In one embodiment of the present invention, the reaction chamber 2 shown in FIG. 1 has the configuration shown in FIG. 1 of U.S. Pat. No. 4,026,735 discussed above in the consideration of the background art, with the tube 4 of FIG. 1 herein being connected to the gas inlet tube 20 shown in FIG. 1 of U.S. Pat. No. 4,026,735. The process of the present invention was then used for the liquid phase epitaxial growth of layers of III-V materials. In particular, epitaxial layers of InP were grown by such a process as generally described in U.S. Pat. No. 4,026,735, using a solution of indium saturated with phosphorus, at a solution temperature of 600°-750° C. In the Table below, there is shown the concentration of impurity carriers (n, per cm$^3$) and the corresponding Hall mobility ($\mu$, cm$^2$/volt-second) in the epitaxial layers of InP grown in pure hydrogen or in hydrogen containing various amounts of water vapor. The results of the Table were obtained by adding 5 to 10 parts per million of water vapor to the hydrogen ambient, and then taking successive samples over a period of time while maintaining continuous processing. As can be seen from the Table, there was a significant reduction in carrier concentration from $2.6 \times 10^{17}$ cm$^{-3}$ when pure hydrogen was used, to $2.1 \times 10^{15}$ cm$^{-3}$ when water vapor was added to the hydrogen. After sample number 8, the water vapor was removed by turning off the source of the water vapor so that the ambient would again be pure hydrogen and the carrier concentration increased again to $1.1 \times 10^{17}$ cm$^{-3}$. With the subsequent addition of water vapor, the carrier concentration again decreased to $2.3 \times 10^{15}$ cm$^{-3}$. This data indicates the feasibility of producing successive epitaxial layers having different carrier concentrations by the process of the present invention, as will be discussed below.

The electron Hall mobility, $\mu$, shown in the Table increases as the carrier concentration decreases, which indicates that the total impurity concentration [i.e. the number of ionized donors ($N_D$) plus the number of ionized acceptors ($N_A$)] of the epitaxial layers grown by the process of the present invention has decreased. Thus, the effect of the water vapor is not a compensation effect, in which case the Hall mobility would decrease when the carrier concentration decreased. Table I should be considered exemplary in nature and not as limiting the scope of the broad process or device claims for this invention.

TABLE I

| Sample Number | Ambient | n, cm$^{-3}$ (300° K.) | $\mu$, cm$^2$ V$^{-1}$ sec$^{-1}$ (300° K.) |
|---|---|---|---|
| 1 | Pure hydrogen | $1.4 \times 10^{17}$ | 2600 |
| 2 | Pure hydrogen | $2.6 \times 10^{17}$ | 2600 |
| 3 | Hydrogen + H$_2$O | $2.1 \times 10^{15}$ | 3500 |
| 4 | Hydrogen + H$_2$O | $2.3 \times 10^{15}$ | 4500 |
| 5 | Hydrogen + H$_2$O | $4.2 \times 10^{15}$ | 4200 |
| 6 | Hydrogen + H$_2$O | $2.3 \times 10^{15}$ | 3800 |
| 7 | Hydrogen + H$_2$O | $2.5 \times 10^{15}$ | 4100 |
| 8 | Hydrogen + H$_2$O | $2.9 \times 10^{15}$ | 4100 |
| 9 | Pure hydrogen | $1.1 \times 10^{16}$ | 3700 |
| 10 | Pure hydrogen | $6.1 \times 10^{16}$ | 3100 |
| 11 | Pure hydrogen | $1.1 \times 10^{17}$ | 3200 |
| 12 | Hydrogen + H$_2$O | $2.3 \times 10^{15}$ | 4200 |

Figure 2:
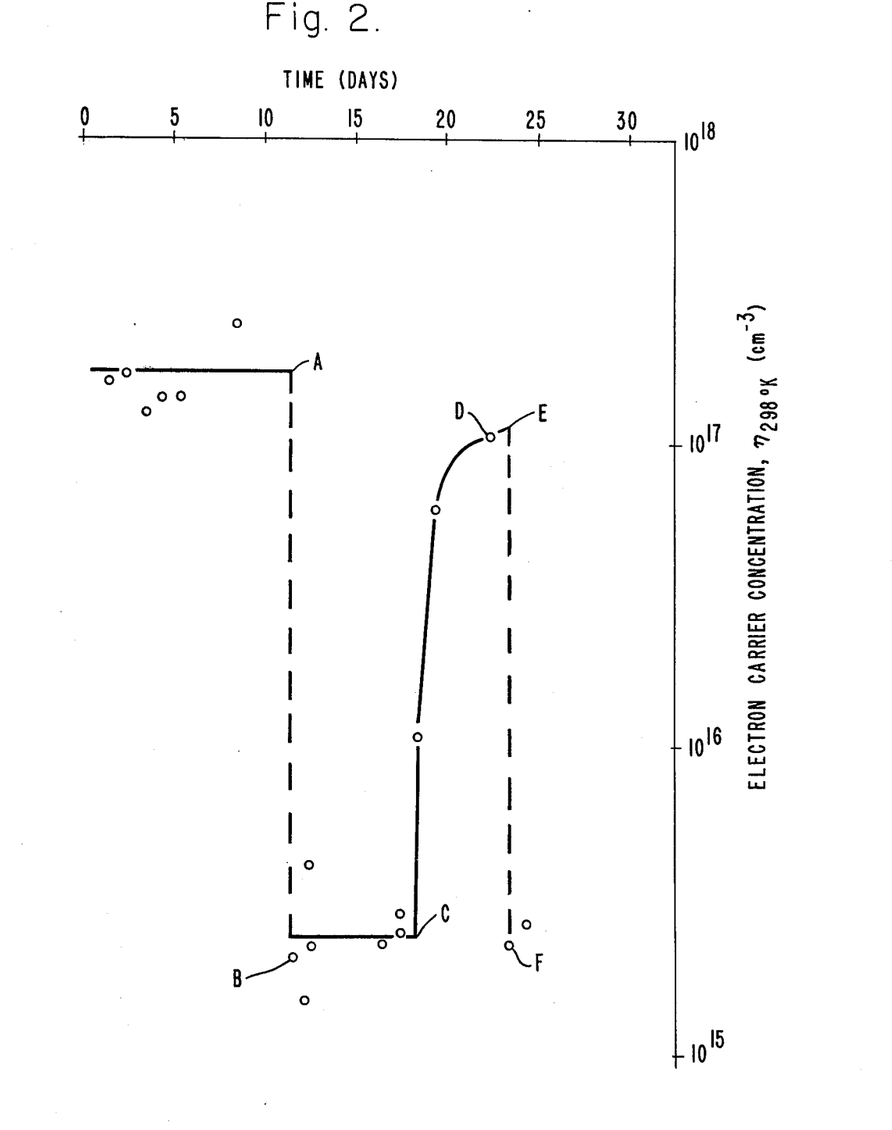
FIG. 2 presents a graph showing the variation in electron carrier concentration as a function of time with the introduction and removal of water vapor during the crystal growth of InP in accordance with the process of the present invention.
Figure 3:
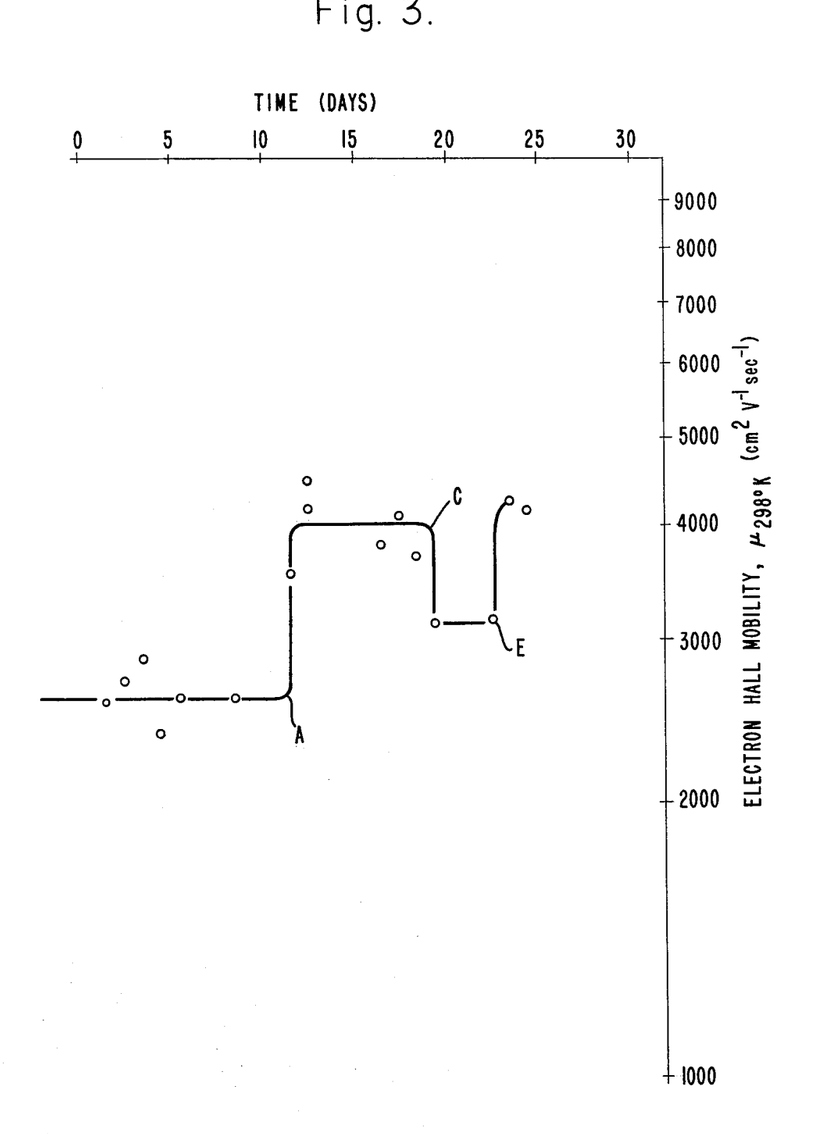
FIG. 3 presents a graph showing the variation in electron Hall mobility as a function of time during the process described in FIG. 2.

The kinetics of the electrical parameters of InP grown in accordance with the process of the present invention exemplified in the Table, as water vapor is introduced into and removed from the growth system are shown in FIGS. 2 and 3. In FIG. 2, the variation in electron carrier concentration (i.e. the number of ionized donors minus the number of ionized acceptors), as a function of time is indicated. Time in days is plotted on the abscissa of FIG. 2 and electron carrier concentration (n), at 298° K., in cm$^{-3}$, is plotted on the ordinate. When water vapor was introduced into the growth system at point A shown in FIG. 2, the electron carrier concentration was approximately $2 \times 10^{17}$ to $3 \times 10^{17}$ cm$^{-3}$. After exposure of the system to water vapor for approximately 3 hours, the electron carrier concentration was reduced to a level of approximately $2 \times 10^{15}$ to $4 \times 10^{15}$ cm$^{-3}$, as indicated at point B in FIG. 2. Upon subsequent removal of the water vapor at point C shown in FIG. 2, the electron carrier concentration increased gradually to point D shown in FIG. 2. Upon re-introduction of water vapor at point E shown in FIG. 2, the electron carrier concentration decreased to point F at a relatively rapid rate. The data of FIG. 2 and FIG. 3, discussed below, indicate the feasibility of producing successive epitaxial layers having different carrier concentrations by the process of the present invention.

In FIG. 3 there is plotted the variation in the electron Hall mobility, $\mu$, at 298° K., in cm$^2$v$^{-1}$sec$^{-1}$, as a function of time in days for the same samples as those used in FIG. 2. Point A in FIG. 3 represents the introduction of water vapor, point C the removal of water vapor, and point E the re-introduction of water vapor, and these points correspond to points A, C and E respectively of FIG. 2. FIG. 3 shows the increase in the Hall mobility which occurs after the addition of water vapor at point A, the decrease in the Hall mobility which occurs after the subsequent removal of water vapor at point C, and the increase in the Hall mobility which occurs after the addition of water vapor at point E. As indicated in FIG. 3, when considered in conjunction with FIG. 2, the Hall mobility increases as the carrier concentration decreases, which indicates a decrease in total impurity concentration in the InP grown in accordance with the process of the present invention.

Figure 4:
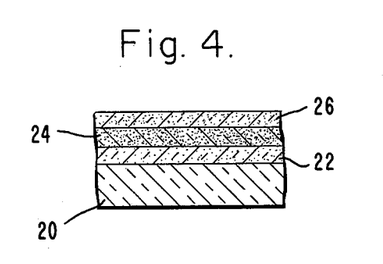
FIG. 4 shows in schematic cross-section a Gunn diode device formed in accordance with the present invention.

Turning now to FIG. 4, there is shown a Gunn diode device formed by the process of an alternative embodiment of the present invention. The device of FIG. 4 has a substrate 20, such as a commercially available n-type InP substrate, upon which is deposited a first epitaxial layer 22, such as indium phosphide having an impurity concentration of approximately $1 \times 10^{17}$ cm$^{-3}$ and formed in accordance with the present invention as described below. On top of the first epitaxial layer 22, there is formed a second epitaxial layer 24, such as indium phosphide having an impurity concentration of approximately $1 \times 10^{15}$ cm$^{-3}$ to $3 \times 10^{16}$ cm$^{-3}$ and formed in accordance with the present invention, as discussed below. On top of the second epitaxial layer 24, there may optionally be formed a third epitaxial layer 26, such as indium phosphide having an impurity concentration in the range of $1 \times 10^{17}$ to $1 \times 10^{19}$ cm$^{-3}$ and formed in accordance with the present invention. Additional epitaxial layers may optionally be formed.

In practicing the present invention to form the device of FIG. 4, the apparatus shown in FIG. 1 is used, with the reaction chamber 2 being an apparatus such as that shown in U.S. Pat. No. 4,026,735. A series of epitaxial layers of a III-V material with different predetermined impurity concentrations and consequently different conductivities is formed on the surface of the substrate 20 as follows, using the general process described in U.S. Pat. No. 4,026,735 in conjunction with the present invention. A crystal growth solution of a III-V material is provided in the reaction chamber 2 made of a silicon-containing material, which serves, at least in part, as the source of the desired silicon impurity. The solution is maintained at a predetermined temperature above the solution liquidus temerature, and the solution is maintained in an atmosphere of hydrogen having a first predetermined amount of water vapor. Then the solution is contacted with the substrate for a first predetermined period of time, while cooling the solution below the liquidus temperature at a first predetermined rate sufficient to cause the single crystal growth of the first epitaxial layer 22 of the III-V material of a first predetermined thickness and a first predetermined silicon impurity concentration. Next, the amount of water vapor in the hydrogen gas is either increased to cause a decrease in the carrier concentration of the layer 24 to be formed or is decreased to cause an increase in the carrier concentration of the layer 24 to be formed. The solution is exposed to an atmosphere of hydrogen containing this second predetermined amount of water vapor. When the water vapor content of the hydrogen is changed, the substrate 20 with layer 22 formed thereon may remain in contact with the crystal growth solution provided that the growth rate is reduced to nearly zero. In this manner, the growth of successive epitaxial layers in accordance with the present invention is continuous, and surface contamination of the initially formed layer is prevented. Optionally, when the water vapor content of the hydrogen in changed, the substrate 20 with layer 22 formed thereon may be removed from the growth solution and then re-immersed in the growth solution after the water vapor content of the hydrogen has been changed. Then, the solution is cooled below the liquidus temperature at a second predetermined rate sufficient to cause the single crystal growth of the second epitaxial layer 24 of III-V material on the first epitaxial layer 22 of III-V material as shown in FIG. 4. This second epitaxial layer 24 of III-V material has a second predetermined thickness and a second predetermined silicon impurity concentration. If the optional third epitaxial layer 26 or successive epitaxial layers are formed, they are formed in a manner similar to that used to form the second epitaxial layer 24. More specifically, the amount of water vapor in the hydrogen gas is increased or decreased as desired and the growth solution is contacted with a hydrogen atmosphere having this third or subsequent predetermined amount of water vapor during the crystal growth process discussed above. The third epitaxial layer 26 has a third predetermined thickness and a third predetermined impurity concentration. As an option, a dopant gas may be added during the crystal growth process so that a given dopant, as well as silicon, is incorporated in a given crystal layer as grown.

As has been discussed in relation to FIG. 3, it has been determined experimentally that, by the process of the present invention, the transition time required to go from an epitaxially grown layer of InP having a free electron carrier concentration of approximately $2 \times 10^{17}$ cm$^{-3}$ to a layer of InP having a free electron carrier concentration of approximately $2 \times 10^{15}$ cm$^{-3}$ is less than 3 hours for a 700 gram solution of InP. Thus, the transition time required to bring about the required concentration changes to form a Gunn diode device by the process of the present invention is not prohibitively high.

By using the process of the present invention to form a Gunn diode device, the crystal growth process is made more straightforward, has a reduced number of steps, and is relatively economical as compared to prior art processes for forming such devices. The present invention may use a single-step, in-situ process in which the water vapor concentration in the hydrogen gas is altered to produce an alteration in the silicon impurity concentration in successive epitaxial layers grown. By some prior art processes for forming a Gunn diode device, 2 or 3 different growth mixtures are required and there is the additional problem of cross-contamination of a subsequent mixture by the previous mixture. The present invention uses a single impurity, i.e., silicon, whose concentration can be controlled and, further, avoids the prior art problem of cross-contamination. In addition, a Gunn device formed by the process of the present invention has lower defect densities and higher reproducibility than similar devices formed by the prior art vapor phase epitaxial process.

The formation of a specific Gunn diode device by the process of the present invention is illustrated in the following example.

EXAMPLE

This example illustrates the formation of a Gunn diode device in accordance with the present invention. A device having the configuration shown in FIG. 4 is formed using the apparatus shown in FIG. 1, with the reaction chamber 2 being the apparatus shown in U.S. Pat. No. 4,026,735. Using the process described in relation to FIG. 4, an n-type InP substrate is used. The growth solution comprises indium saturated with phosphorus. Layer 22 shown in FIG. 4 is grown in an ambient of pure hydrogen at a flow rate of approximately 100 cm$^3$ per minute and at an average chamber temperature of 680° C., to a thickness of 5–10 micrometers. The impurity concentration in layer 22 is approximately $1 \times 10^{17}$ cm$^{-3}$. Next, water vapor is added to the growth system as described in relation to FIG. 1, to provide 0.1 to 10 parts per million of water vapor in the hydrogen ambient. By appropriate cooling, layer 24 shown in FIG. 4 is then deposited to a thickness of 0.5 to 5 micrometers and has an impurity concentration of approximately $1 \times 10^{15}$ to $3 \times 10^{16}$ cm$^{-3}$. Finally, the introduction of water vapor is ceased and pure hydrogen is again introduced into the crystal growth chamber. By appropriate cooling, layer 26 shown in FIG. 4 is then deposited to a thickness of 1 to 20 micrometers and has an impurity concentration of $1 \times 10^{17}$ to $1 \times 10^{19}$ cm$^{-3}$.

While the present invention has been particularly described with respect to the preferred embodiments thereof, it will be recognized by those skilled in the art that certain modifications in form and detail may be made without departing from the spirit and scope of the invention. In particular, the scope of the invention is not limited to the formation of crystals of indium phosphide, which was used as an example, but includes other materials of elements of Groups III and V of the periodic table in which silicon may be incorporated as an impurity. Further, the present invention is not limited to the particular epitaxial and bulk crystal growth processes discussed herein, but finds utility in any crystal growth process, including vapor phase growth processes, in which a reaction chamber and associated apparatus made of a silicon-containing material is used and provides a source of silicon impurities to be incorporated in the crystal as grown. Further, the present invention may also be used in a crystal growth process in which the source of silicon impurities is the starting materials used to prepare the growth solution or melt. In addition, the present invention is not limited to the particular apparatus shown and described, but includes modifications in the form and detail thereof as may be apparent to one skilled in the art. Furthermore, it is not intended to restrict the present invention to a Gunn diode device, but rather it is intended to include any multi-layer semiconductor device formed from III-V materials, in which the silicon dopant concentration in the individual layers is varied. In addition, this invention is not limited to the particular Gunn diode device shown, but includes Gunn diode devices having any number of epitaxial layers and various impurity profiles which provide the necessary performance characteristics.

We claim:

1. A process for controlling the conductivity of a selected Group III-V semiconductor material as said material is grown in monocrystalline form, which includes the steps of:
   (a) exposing said material to a source of silicon atoms;
   (b) passing a gaseous mixture including hydrogen and water vapor over said material; and
   (c) controlling the percentage of water vapor in said mixture, whereby the concentration of silicon impurities in said material is suppressed in proportion to the water vapor content in said mixture and thereby permits a corresponding control over the silicon-impurity-dependent-conductivity of said material.

2. The process defined in claim 1 wherein said semiconductor material is indium phosphide grown from a solution or melt in an environment containing a silicon impurity.

3. A process for growing a crystal of a material formed from elemens of Groups III and V comprising the steps of:
   (a) providing a crystal growth solution or melt of starting materials comprising said elements of Groups III and V;
   (b) providing a crystal growth apparatus comprising a reaction chamber and associated tubing;
   (c) maintaining an atmosphere of hydrogen to which a predetermined amount of water vapor has been added, within said chamber for a predetermined period of time;
   (d) growing said crystal from said crystal growth solution or melt in said reaction chamber in the presence of said hydrogen containing said water vapor whereby said water vapor suppresses the concentration of silicon impurities from said reaction chamber, said associated tubing, and/or said starting materials, incorporated in said crystal.

4. A process for forming an epitaxial layer of a material formed from elements of Groups III and V, on a selected substrate comprising the steps of:
   (a) providing a crystal growth apparatus comprising a reaction chamber and associated tubing;
   (b) providing a crystal growth solution of said material formed from elements of Groups III and V, at a predetermined temperature above the solution liquidus temperature thereof, said solution being contained within said reaction chamber;
   (c) maintaining said solution for a first predetermined period of time in an atmosphere of purified hydrogen to which a predetermined amount of water vapor has been added; and
   (d) contacting said solution with said substrate for a second predetermined period of time, while cooling said solution below said liquidus temperature at a predetermined rate sufficient to cause the single crystal growth of said layer of said material on said substrate whereby the silicon impurity concentration in said layer of said material is suppressed by said water vapor.

5. The process set forth in claim 4 which further comprises: after providing said crystal growth solution, adding a predetermined amount of a selected dopant to said solution.

6. A process for forming an epitaxial layer of indium phosphide of high purity on a selected substrate comprising the steps of:
   (a) providing a crystal growth apparatus comprising a quartz reaction chamber and associated tubing;
   (b) providing a crystal growth solution of indium phosphide at a solution temperature in the range of 600°–750° C.;
   (c) maintaining said solution for a first predetermined period of time in an atmosphere of purified hydrogen to which water vapor has been added to a concentration of less than approximately 10 parts per million;
   (d) contacting said solution with said substrate for a second predetermined period of time, while cooling said solution below said range of 600°–750° C. at a predetermined rate sufficient to cause the single crystal growth of said layer of indium phosphide of high purity on said substrate whereby the total impurity concentration in said layer of indium phosphide is less than $1 \times 10^{16}$ impurity atoms per cubic centimeter.

7. In a process for forming an epitaxial layer of a material formed from elements of Groups III and V on a selected substrate which comprises providing a crystal growth apparatus comprising a reaction chamber and associated tubing, providing a crystal growth solution of starting materials comprising said elements of Groups III and V at a predetermined temperature above the solution liquidus temperature, maintaining said solution in an atmosphere of purified hydrogen, and contacting said solution with said substrate for a first predetermined period of time, while cooling said solution below said liquidus temperature at a predetermined rate sufficient to cause the single crystal growth of said layer of said material, the improvement comprising adding a predetermined amount of water vapor to said hydrogen for a second predetermined period of time whereby said water vapor suppresses the silicon impurity concentration in said layer of said material as grown.

8. A process for forming a series of epitaxial layers of a Group III-V material with different predetermined impurity concentrations on a selected substrate comprising the steps of:
(a) providing a crystal growth apparatus comprising a reaction chamber and associated tubing, formed from a silicon-containing material;
(b) providing a crystal growth solution of said Group III-V material at a predetermined temperature above the solution liquidus temperature;
(c) maintaining said solution for a first predetermined period of time in an atmosphere of purified hydroge to which a first predetermined amount of water vapor has been added;
(d) contacting said solution with said substrate for a second predetermined period of time, while cooling said solution below said liquidus temperature at a first predetermined rate sufficient to cause the single crystal growth of a first epitaxial layer of said Group III-V material, said first layer having a first predetermined silicon impurity concentration and a first predetermined thickness;
(e) exposing said solution for a third predetermined period of time to said atmosphere of purified hydrogen to which a second or subsequent predetermined amount of water vapor has been added; and
(f) contacting said solution with said substrate having said first epitaxial layer formed thereon, for a fourth or subsequent predetermined period of time, while cooling said solution below said liquidus temperature at a second or subsequent predetermined rate sufficient to cause the single crystal growth of a second or subsequent epitaxial layer of said Group III-V material on the previously formed epitaxial layer, said second or subsequent layer having a second or subsequent predetermined silicon impurity concentration and a second or subsequent predetermined thickness, whereby the amount of said water vapor in said hydrogen controls said silicon impurity concentrations in said first and said second or subsequent epitaxial layers.

9. The process as set forth in claim 8 which further comprises adding a predetermined amount of a selected dopant to said solution prior to step "c" or step "e" or both.

10. A process for growing a crystal of a material formed from elements of Groups III and V comprising the steps of:
(a) providing a crystal growth apparatus comprising a reaction chamber and associated tubing;
(b) providing a seed crystal of said material formed from elements of Groups III and V;
(c) immersing said seed crystal in a solution or melt of said material contained in said reaction chamber, said solution or melt having a predetermined and controlled temperature;
(d) maintaining an atmosphere of hydrogen to which a predetermined amount of water vapor has been added, within said reaction chamber for a predetermined period of time; and
(e) pulling said seed crystal from said solution or melt at a predetermined rate to form said crystal of said material whereby the concentration of silicon in said crystal as grown is minimized by said water vapor.

11. In a process for forming a crystal of a material formed from elements of Groups III and V which comprises the steps of providing a crystal growth apparatus comprising a reaction chamber and associated tubing, providing a seed crystal of said material, immersing said seed crystal in a melt of said material contained in said reaction chamber, maintaining an atmosphere of hydrogen within said reaction chamber, and pulling said seed crystal from said melt at a predetermined rate to form said crystal of said material, the improvement comprising adding a predetermined amount of water vapor to said hydrogen for a predetermined period of time whereby said water vapor suppresses the concentration of silicon in said crystal as grown.

* * * * *